(12) United States Patent
Ho et al.

(10) Patent No.: US 7,750,388 B2
(45) Date of Patent: Jul. 6, 2010

(54) TRENCH METAL-INSULATOR METAL (MIM) CAPACITORS

(75) Inventors: Herbert L. Ho, New Windsor, NY (US); Subramanian S. Iyer, Mount Kisco, NY (US); Vidhya Ramachandran, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/961,076

(22) Filed: Dec. 20, 2007

(65) Prior Publication Data
US 2009/0159948 A1    Jun. 25, 2009

(51) Int. Cl.
*H01L 31/062* (2006.01)
*H01L 29/94* (2006.01)
*G06F 9/45* (2006.01)

(52) U.S. Cl. .............. 257/301; 257/300; 257/E27.092; 257/E27.093; 257/E27.034; 257/E29.346; 438/243; 716/5; 716/12

(58) Field of Classification Search ................ 257/301, 257/300, E27.016, E27.034, E27.092–E27.093, 257/E29.346, E21.655; 438/243; 716/5, 716/12
See application file for complete search history.

(56) References Cited

U.S. PATENT DOCUMENTS

| | | | |
|---|---|---|---|
| 4,673,962 A |  | 6/1987 | Chatterjee et al. |
| 4,803,535 A | * | 2/1989 | Taguchi ..................... 257/301 |
| 5,981,332 A |  | 11/1999 | Mandelman et al. |
| 6,249,017 B1 | * | 6/2001 | Togo ......................... 257/301 |
| 6,711,729 B1 | * | 3/2004 | McElvain et al. ............. 716/18 |
| 7,092,234 B2 | * | 8/2006 | Basceri et al. .............. 361/311 |
| 7,265,020 B2 | * | 9/2007 | Furuhata et al. ............. 438/386 |
| 7,275,233 B2 | * | 9/2007 | McElvain et al. ............. 716/18 |
| 7,276,751 B2 | * | 10/2007 | Ho et al. ..................... 257/296 |
| 7,304,342 B2 | * | 12/2007 | Nirschl et al. ................ 257/301 |
| 7,388,244 B2 | * | 6/2008 | Ho et al. ..................... 257/301 |
| 2002/0190298 A1 | * | 12/2002 | Alsmeier et al. ............. 257/301 |
| 2003/0045068 A1 | * | 3/2003 | Gutsche et al. ............. 438/386 |
| 2003/0149954 A1 | * | 8/2003 | McElvain et al. ............. 716/18 |

(Continued)

OTHER PUBLICATIONS

U.S. Appl. No. 11/162,776, entitled "Trench Metal-Insulator-Metal (MIM) Capacitors and Method of Fabricating Same" filed on Sep. 22, 2005, First Named Inventor: Herbert Ho.

*Primary Examiner*—Zandra Smith
*Assistant Examiner*—Jeremy J Joy
(74) *Attorney, Agent, or Firm*—Scully, Scott, Murphy & Presser, P.C.; Yuanmin Cai

(57) ABSTRACT

The present invention relates to a semiconductor device that contains a trench metal-insulator-metal (MIM) capacitor and a field effect transistor (FET), and a design structure including the semiconductor device embodied in a machine readable medium. The trench MIM capacitor comprises a first metallic electrode layer located over interior walls of a trench in a substrate, a dielectric layer located in the trench over the first metallic electrode layer, and a second metallic electrode layer located in the trench over the dielectric layer. The FET comprises a source region, a drain region, a channel region between the source and drain regions, and a gate electrode over the channel region. The trench MIM capacitor is connected to the FET by a metallic strap. The semiconductor device of the present invention can be fabricated by a process in which the trench MIM capacitor is formed after the FET source/drain region but before the FET source/drain metal silicide contacts, for minimizing metal contamination in the FET.

14 Claims, 10 Drawing Sheets

U.S. PATENT DOCUMENTS

2004/0061161 A1    4/2004  Radens et al.
2004/0147074 A1*   7/2004  Sell et al. .................... 438/243
2004/0195612 A1   10/2004  Divakaruni et al.
2006/0057814 A1    3/2006  Weis
2007/0063244 A1*   3/2007  Ho et al. ..................... 257/301
2007/0238244 A1*  10/2007  Lin et al. .................... 438/243
2008/0092094 A1*   4/2008  Coolbaugh et al. ............. 716/4
2009/0159948 A1*   6/2009  Ho et al. ..................... 257/301

* cited by examiner

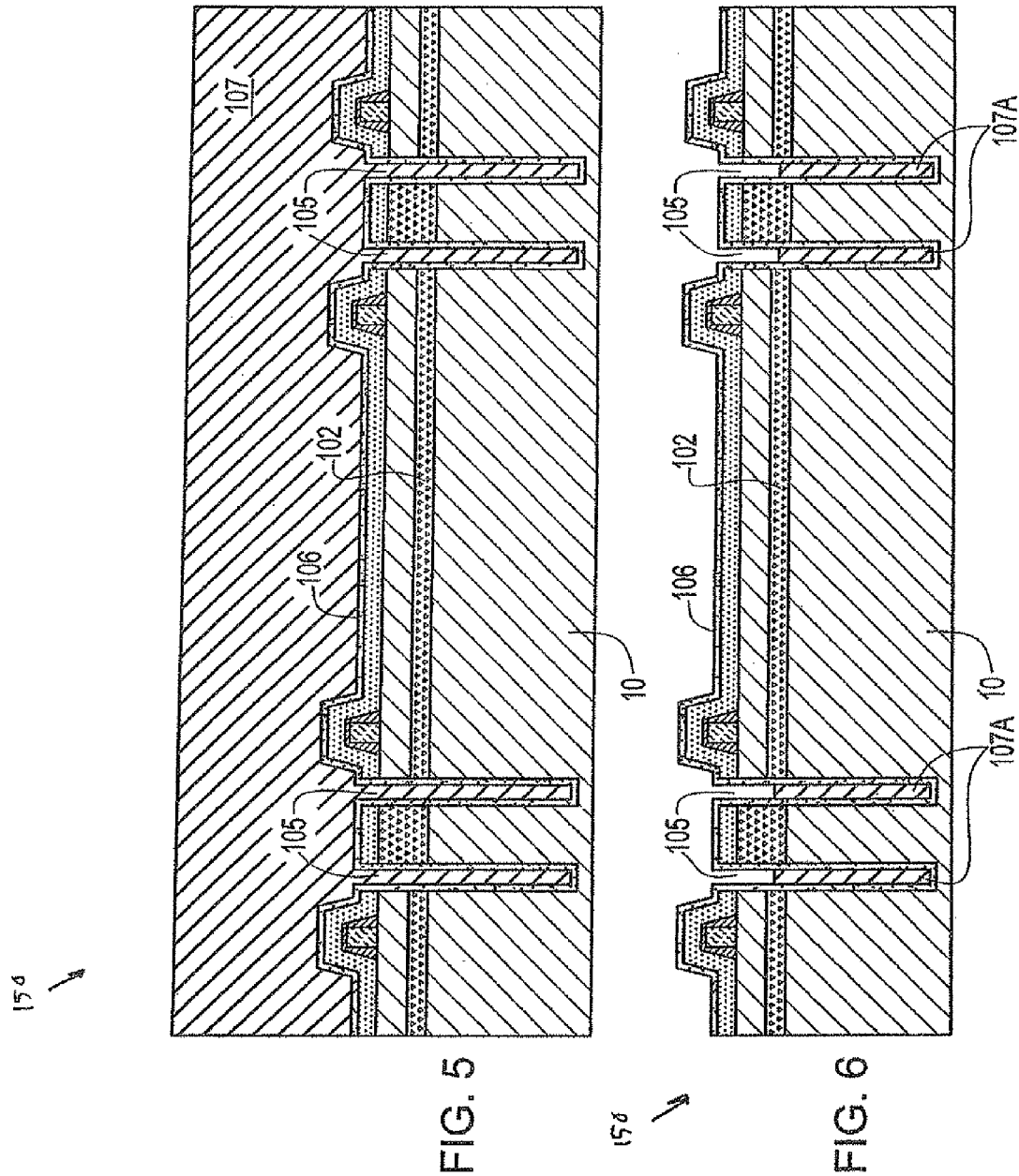

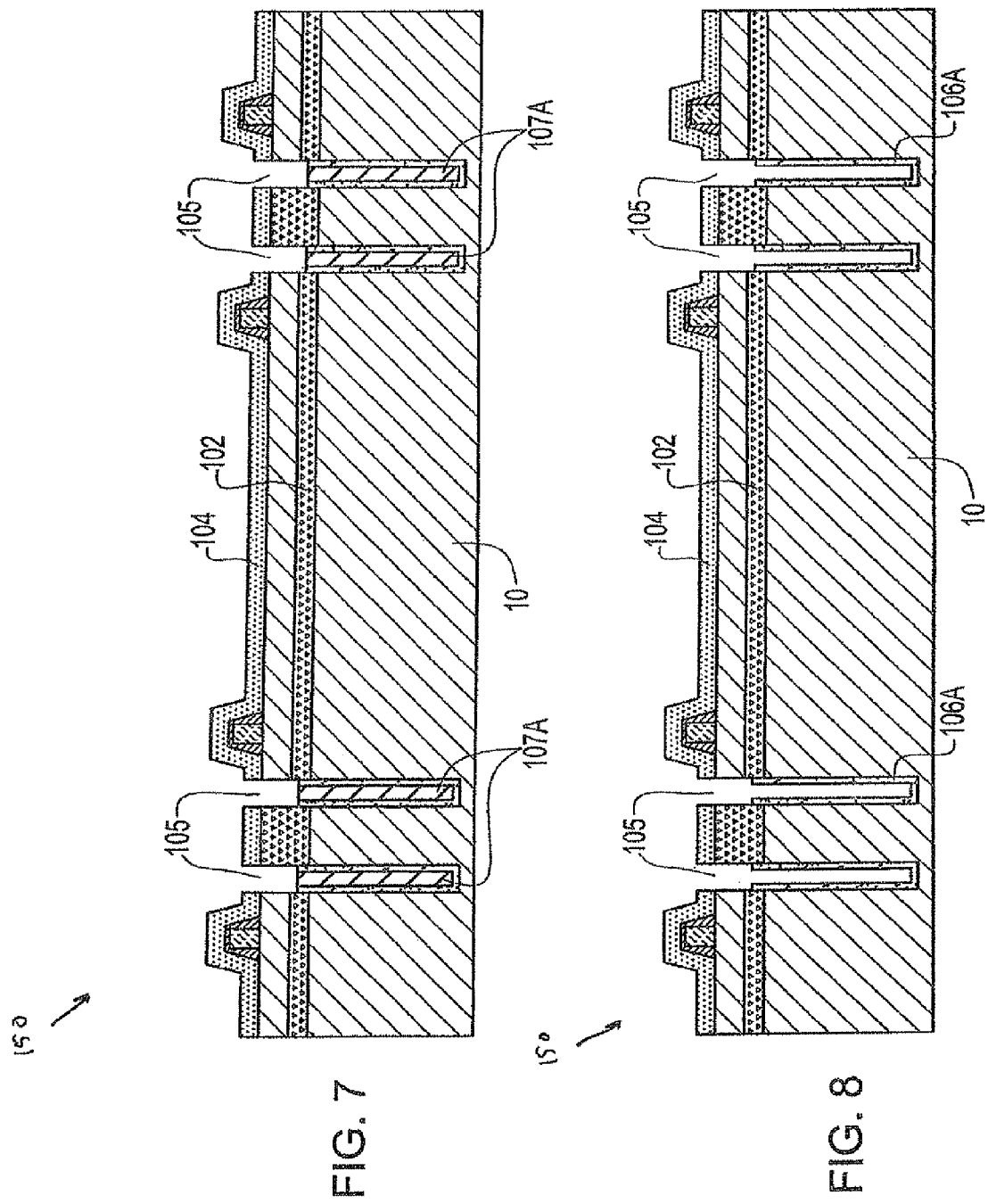

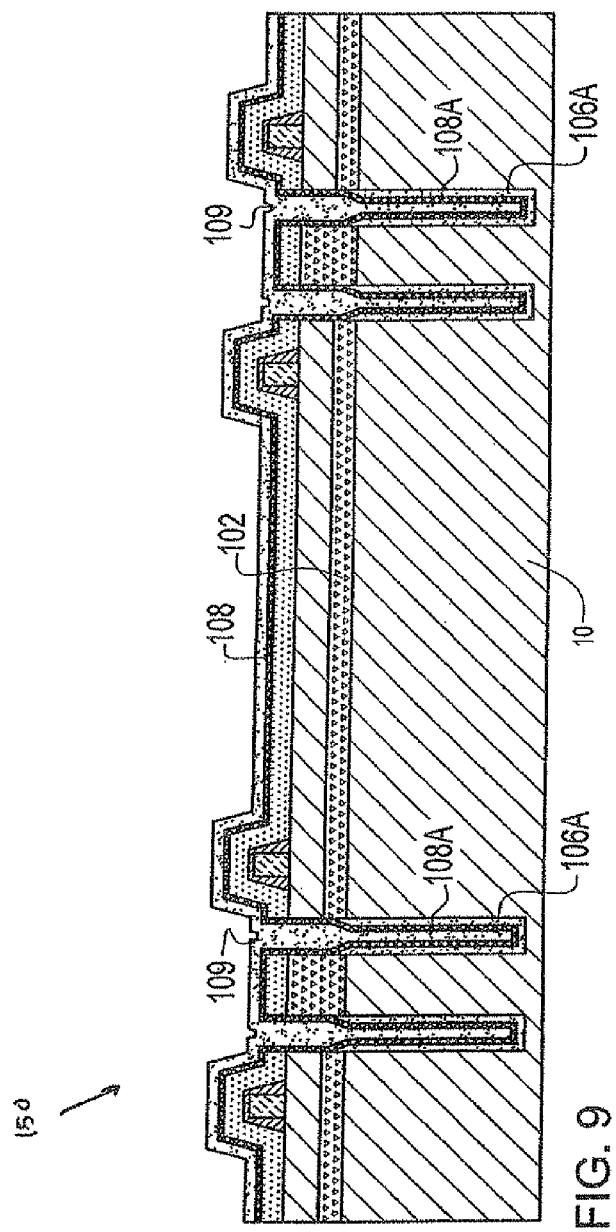
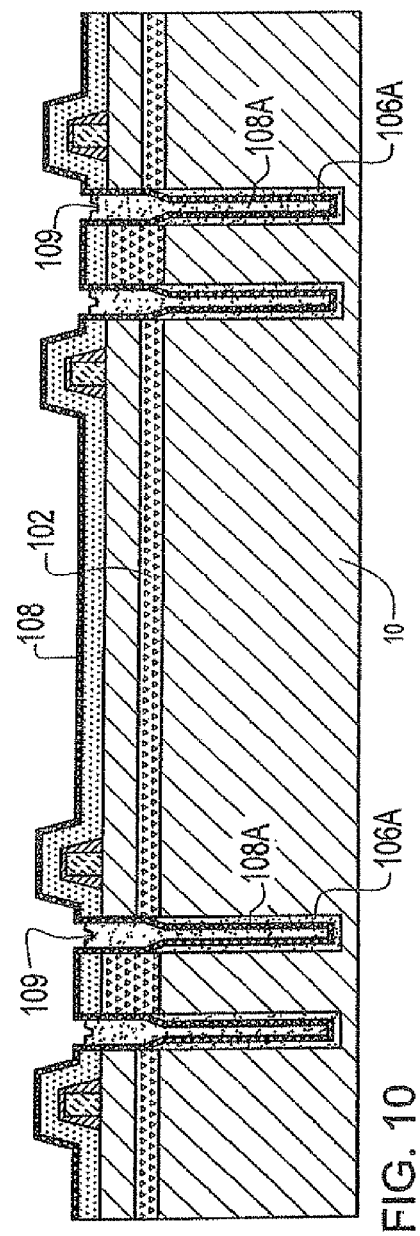
FIG. 9
FIG. 10

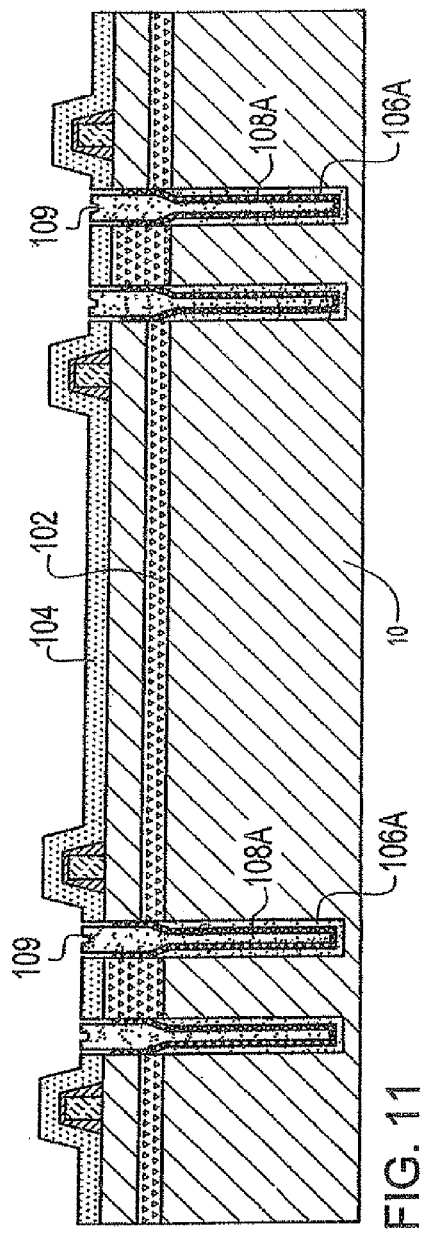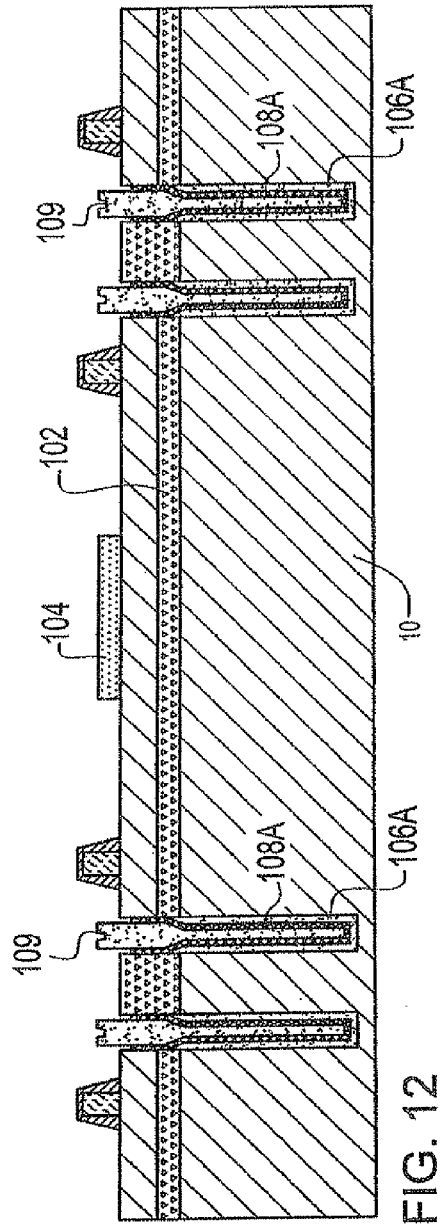

TRENCH METAL-INSULATOR METAL (MIM) CAPACITORS

This application is related to co-assigned U.S. patent application Ser. No. 11/162,776, filed Sep. 22, 2005, now U.S. Pat. No. 7,388,244.

FIELD OF THE INVENTION

The present invention generally relates to a trench metal-insulator-metal (MIM) capacitor. More specifically, the present invention relates to a semiconductor memory device that contains a field effect transistor (FET) and a trench MIM capacitor which are connected to each other by a metallic strap, and a design structure including the semiconductor memory device embodied in a machine readable medium.

BACKGROUND OF THE INVENTION

Embedded memory devices, such as embedded dynamic random access memory (eDRAM), having deep trench capacitors have demonstrated great advantages over planar-stacked device structures. Trench capacitors have replaced the planar storage capacitors in order to meet the scaling demands for high performance dynamic random access memory (DRAM) cell production.

A trench capacitor is a three-dimensional device formed by etching a trench into a semiconductor substrate. After trench etching, a doped region is typically formed in the lower portion of the trench surrounding interior walls of the trench, which serves as an outer electrode or a buried plate electrode of the trench capacitor. A node dielectric is then formed over the outer or buried plate electrode in the trench, which serves as the insulating layer of the trench capacitor, followed by filling the trench, for example, with doped polycrystalline silicon (hereinafter poly-Si), which serves as the inner or upper electrode of the trench capacitor.

However, the doped poly-Si inner or upper electrode of the conventional trench capacitor as described hereinabove has a relatively high electrical resistivity as compared to metallic electrodes. Further, the conventional trench capacitor in an eDRAM or DRAM device is connected to an adjacent field effect transistor (FET) by an out-diffused buried strap, which is also highly resistive. The highly resistive poly-Si electrode and out-diffused buried strap lead to high parasitic resistance in the eDRAM or DRAM device, which in turn limits the performance of the device. As eDRAM and DRAM technologies are scaled beyond the 65 nm node, the deleterious impact of the highly resistive poly-Si electrode and out-diffused buried strap on the performance of the eDRAM or DRAM cells, especially on the read/write speed of such memory cells, becomes much more significant, because the resistivity of the poly-Si electrode and the out-diffused buried strap does not scale with the remaining components of the eDRAM or DRAM cell.

There is therefore a continuing need for improved trench capacitor structures that can be readily incorporated into the eDRAM or DRAM devices to reduce the parasitic resistance in such devices and to enhance the performance, especially the read/write speed, of such devices.

There is further a need for a method that can readily integrate the processing steps required for fabricating such improved trench capacitor structures into the eDRAM or DRAM device fabrication processes, with little or no deleterious impact on the performance of the transistors that are formed adjacent to the trench capacitor structures in the eDRAM or DRAM devices.

SUMMARY OF THE INVENTION

The present invention in one aspect relates to a semiconductor device, comprising:

at least one trench capacitor that comprises a first metallic electrode layer located over interior walls of a trench in a substrate, a dielectric layer located in the trench over the first metallic electrode layer, and a second metallic electrode layer located in the trench over the dielectric layer; and at least one field effect transistor (FET) located on the substrate, said at least one FET comprising a source region, a drain region, a channel region between the source and drain regions, and a gate electrode over the channel region, wherein the second metallic electrode layer of the trench capacitor is electrically connected to at least one of the source and drain regions of the at least one FET by a metallic strap.

The term "metallic" as used herein refers to a structure or component that is formed essentially of a conductive material containing at least one metal in an elemental form, an alloy form, or a compound form. Examples of such conductive material include, but are not limited to: elemental metals, metal alloys, metal nitrides, metal silicides, etc.

The first and second metallic electrode layers of the trench capacitor of the present invention preferably, but not necessarily, comprise at least one metallic material selected from the group consisting of Ti, TiN, W, WN, Ru, and combinations thereof.

The trench capacitor may be located either in a semiconductor-on-insulator (SOI) substrate or a bulk semiconductor substrate. For a bulk semiconductor substrate, it is preferred that the trench sidewalls have p-type implants, or that the trench is located in a p-well in the substrate.

The metallic strap connecting the trench capacitor and the FET preferably comprises a metal silicide. Further, the source and drain regions of the FET preferably comprise a metal silicide contact layer. More preferably, the trench capacitor comprises a metal silicide layer located between the first metallic electrode layer and the interior walls of the trench in the substrate. The metal silicide strap, the source/drain metal silicide contact layer, and the metal silicide layer located between the first metallic electrode layer and the interior walls of the trench can all be formed by a salicidation process, which is to be described in greater detail hereinafter.

A further aspect of the present invention relates to a method for forming a semiconductor device. The method comprises:

forming at least one field effect transistor (FET) on a substrate, wherein said at least one FET comprises a source region, a drain region, a channel region between the source and drain regions, and a gate electrode over the channel region;

forming a trench in said substrate;

forming a first metallic electrode layer over interior walls of the trench;

forming a dielectric layer in said trench over the first metallic electrode layer;

forming a second metallic electrode layer in said trench over the dielectric layer; and forming a metal silicide contact layer in the source and drain regions of the at least one FET and a metal silicide strap between the at least one FET and the trench capacitor, wherein the metal silicide strap electrically connects the second metallic electrode layer of the trench capacitor and at least one of the source and drain regions of the at least one FET.

The FET source/drain metal silicide contact layer and the metal strap as described hereinabove can be formed by a self-aligned silicidation, e.g., salicidation, process, in which a metal layer is first deposited over the substrate to cover both the FET and the trench capacitor, and the metal layer is then annealed at an elevated temperature to form the source/drain metal silicide contact layer and the metal silicide strap, followed by removal of any unreacted metal from surface of the substrate.

During the annealing, metal components in the first metallic electrode layer of the trench capacitor may react with the semiconductor material in the interior walls of the trench, to form a metal silicide layer between the first metallic electrode layer and the interior trench walls. Moreover, a portion of unreacted metal may remain in the trench and form a metal contact between the second metallic electrode layer of the trench capacitor and the metal silicide strap.

In another aspect of the invention, a design structure embodied in a machine readable medium is also provided that includes:

at least one trench capacitor that comprises a first metallic electrode layer located over interior walls of a trench in a substrate, a dielectric layer located in said trench over the first metallic electrode layer, and a second metallic electrode layer located in said trench over the dielectric layer; and at least one field effect transistor (FET) located on said substrate, said at least one FET comprising a source region, a drain region, a channel region between the source and drain regions, and a gate electrode over the channel region, wherein the second metallic electrode layer of the trench capacitor is electrically connected to at least one of the source and drain regions of the at least one FET by a metallic strap.

In another aspect of the invention, a design structure embodied in a machine readable medium is also provided that includes:

at least one trench capacitor that comprises a first metallic electrode layer located over interior walls of a trench in a substrate, a dielectric layer located in said trench over the first metallic electrode layer, and a second metallic electrode layer located in said trench over the dielectric layer; and at least one field effect transistor (FET) located on said substrate, said at least one FET comprising a source region, a drain region, a channel region between the source and drain regions, and a gate electrode over the channel region, wherein the second metallic electrode layer of the trench capacitor is electrically connected to at least one of the source and drain regions of the at least one FET by a metal silicide strap.

Other aspects, features and advantages of the invention will be more fully apparent from the ensuing disclosure and appended claims.

BRIEF DESCRIPTION OF THE DRAWINGS

FIGS. 1-15 are cross sectional views that illustrate the processing steps for forming an exemplary semiconductor memory device having a trench MIM capacitor and a FET connected by a metal silicide strap, according to one embodiment of the present invention.

DETAILED DESCRIPTION OF THE INVENTION

Figure 1:
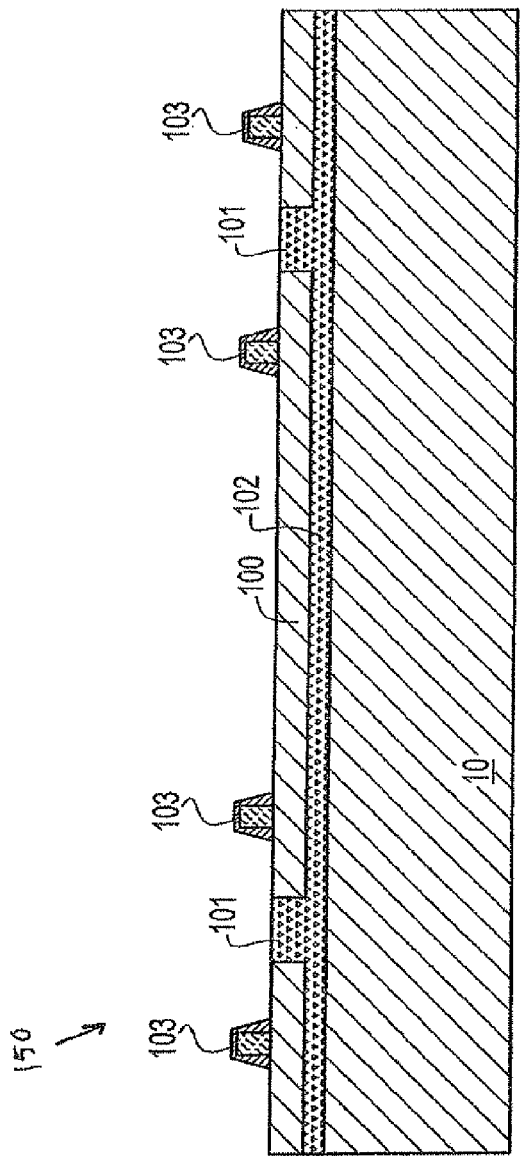

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention provides a solution to the parasitic series resistance problem associated with eDRAM or DRAM devices that contain the conventional trench capacitors having the high resistivity poly-Si electrodes and being connected to adjacent FETs by the high resistivity out-diffusion buried straps, as described hereinabove. Specifically, the present invention provides improved trench capacitors with metallic electrodes, which have significantly lower resistivity than that of the poly-Si electrodes in the conventional trench capacitors.

The trench capacitors of the present invention may be incorporated into eDRAM or DRAM devices that also contain transistors. The trench capacitors are preferably connected to adjacent transistors in the eDRAM or DRAM devices by metallic (more preferably metal silicide) straps of relatively low resistivity, in comparison with the conventional out-diffusion buried straps. The trench capacitors of the present invention may also be used in other applications, such as decoupling capacitors and so on, while having metallic electrodes raises the frequency of operation and improves the linear response in such other applications.

While introducing metal into deep trench capacitors may be seen as a logical progression in the advance of such devices, it is important to note that there are many obstacles that have halted any actual progress in this direction. Most deep trench capacitors are processed before the active FET devices are formed in the semiconductor substrate. Introducing metal to the semiconductor substrate or exposing the substrate to a metal-processing tool before formation of the FET devices greatly magnifies the risk of metal contamination and the deleterious impact thereof on the device performance, because the high temperature processing steps required for transistor fabrication allow any metal atoms present in the semiconductor substrate to migrate into the active region of the chip and destroy the transistor performance.

The present invention therefore provides a method for integrating the processing steps required for fabricating the trench capacitors of the present invention into the conventional eDRAM or DRAM device fabrication processes. The method of the present invention minimizes the risk of metal contamination or migration during the transistor fabrication process, and results in little or no damage to the active region of the transistors formed adjacent to the trench capacitors in the eDRAM or DRAM devices.

Specifically, the present invention first forms the transistor components, such as the source/drain regions and the poly-Si gate electrodes, without introducing any metal species and thus minimizing the risk of metal contamination or migration during the transistor fabrication process. Then, the trench capacitors are formed in the substrate with the transistor components being protected by a barrier layer, followed by a salicidation step that forms the metal silicide contact layers for the transistors and the metal silicide straps for connecting the trench capacitors and the transistors. Thus the metallic species are introduced on the wafer just before or in concomitance with other metal-related processes in the basic process sequence.

Such a method, as well as the resulting device structure, will now be described in greater detail by referring to the accompanying FIGS. 1-15. Note that in these drawings, which are not drawn to scale, like and/or corresponding elements are referred to by like reference numerals. It is further noted that in the drawings, only four FETs and four trench capacitors are shown on/in a semiconductor substrate. Although illustration is made to such an embodiment, the present invention is not limited to the formation of any specific number of trench capacitors and/or FETs in/on the semiconductor substrate.

Reference is first made to FIG. 1, which shows a semiconductor substrate 10, after the completion of all processes pertaining to the fabrication of shallow trench isolation 101 and transistors 103. The semiconductor substrate 10 may comprise any semiconductor material including, but not limited to: Si, SiC, SiGe, SiGeC, Ge alloys, GaAs, InAs, InP, as well as other III-V or II-VI compound semiconductors. Semiconductor substrate 10 may also be comprised of a layered semiconductor structure such as Si/SiGe, a silicon-on-insulator structure or a SiGe-on-insulator structure. In some embodiments of the present invention, it is preferred that the semiconductor substrate 10 be composed of a Si-containing semiconductor material, i.e. a semiconductor material that includes silicon. The semiconductor substrate 10 may be doped, undoped or contain doped and undoped regions therein (not shown). The doped device regions are typically known as "wells".

In the specific embodiment shown in FIG. 1, the transistors 103 are fabricated on an upper surface of a semiconductor-on-insulator (SOI) substrate 10 that contains a semiconductor layer 100, a buried insulator layer 102, and a semiconductor base layer that is located underneath the buried insulator layer 102. The buried insulator layer 102 may comprise a crystalline or an amorphous oxide or nitride, with an amorphous oxide being preferred. While this embodiment of the invention is illustrated using a SOI substrate, it is understood that the present invention can be easily extended to a bulk semiconductor substrate, and the possible difference in process steps for the SOI substrate and the bulk semiconductor substrate, if any, will be mentioned at the appropriate steps to be described hereinafter.

The shallow trench isolation regions 101 are formed into the semiconductor substrate 10, to provide isolation between doped device regions. The shallow trench isolation regions can be readily formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. The shallow trench isolation regions 101 can extend to the buried insulator layer 102, as is shown in FIG. 1, or they may not extend down to the surface of layer 102.

The transistors 103 are formed by conventional front-end-of-line (FEOL) processing steps. For example, deposition, lithography, etching, and implantation can be used, or a replacement gate process can be used. The transistors 103 are preferably field effect transistors (FETs) having source/drain regions, gate electrodes, and optionally source/drain extension regions and source/drain halo regions (not shown). No metal silicide contact layers have been formed in the source and drain regions or the gate electrodes at this point of the inventive method.

Figure 2:
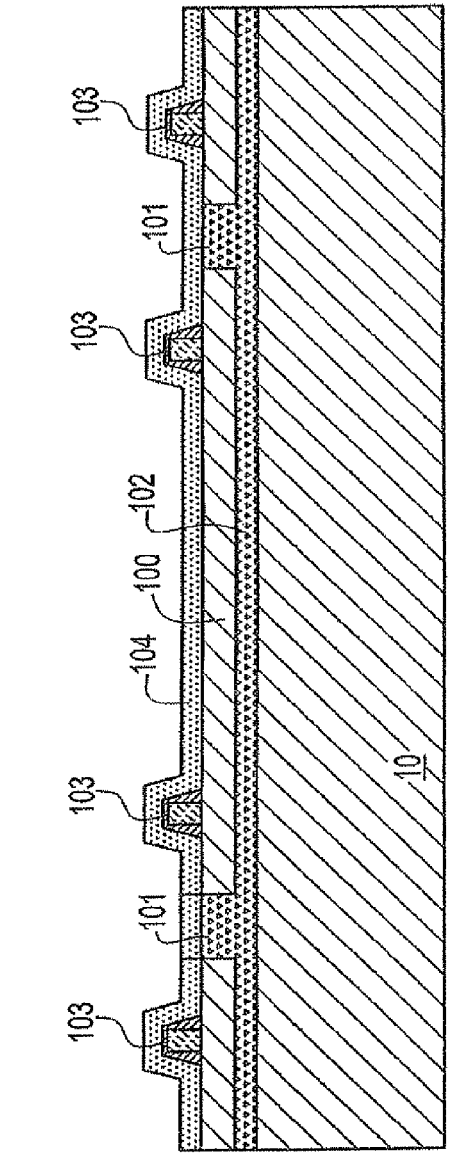

FIG. 2 shows the deposition of a barrier layer 104 over the entire structure of FIG. 1. The barrier layer 104 is preferably, but not necessarily, a silicon nitride film having a thickness ranging from about 3000 Å to about 1 μm. The barrier layer functions to: (1) act as a barrier between the semiconductor material and the silicide-forming metal to be deposited in subsequent steps and prevent migration of the metal species into the active regions of the transistors, and (2) act as a hard-mask for forming deep trenches in the semiconductor substrate 10 for the trench capacitors.

Figure 3:
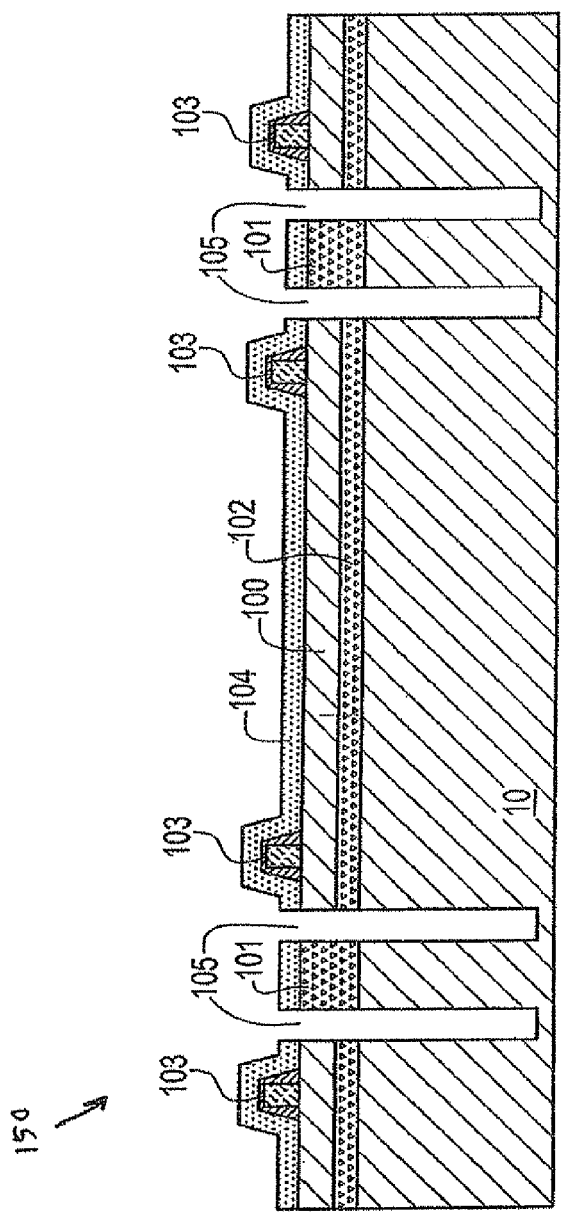

After deposition of the barrier layer 104, deep trenches 105 are etched in the semiconductor substrate 10, using the barrier layer 104 as a hard mask. There are no further masking steps pertaining to the trench capacitors in the process of the present invention, so this is a single masking step that is additional to the conventional trench capacitor fabrication process. Specifically, during the trench-etching step, a photoresist (not shown) is applied to the semiconductor substrate 10 over the barrier layer 104. The photoresist can be applied by any suitable technique, including, but not limited to: coating or spin-on techniques. A mask (not shown) that is patterned with trench shapes is formed over the photoresist, and the mask pattern is transferred to the photoresist using a photolithographic process, which creates recesses in the uncovered regions of the photoresist. The patterned photoresist is subsequently used to create the same pattern of recesses in the barrier layer 104, using a reactive ion etching (RIE) process. The photoresist may or may not be stripped from the semiconductor substrate 10 after the barrier layer 104 is patterned. The entire structure is then exposed to a plasma based RIE process or any other dry etching process for forming deep trenches 105 in the semiconductor substrate 10, as shown in FIG. 3. The preferred depth of these trenches may range from about 1 to about 7 μm.

Figure 4:
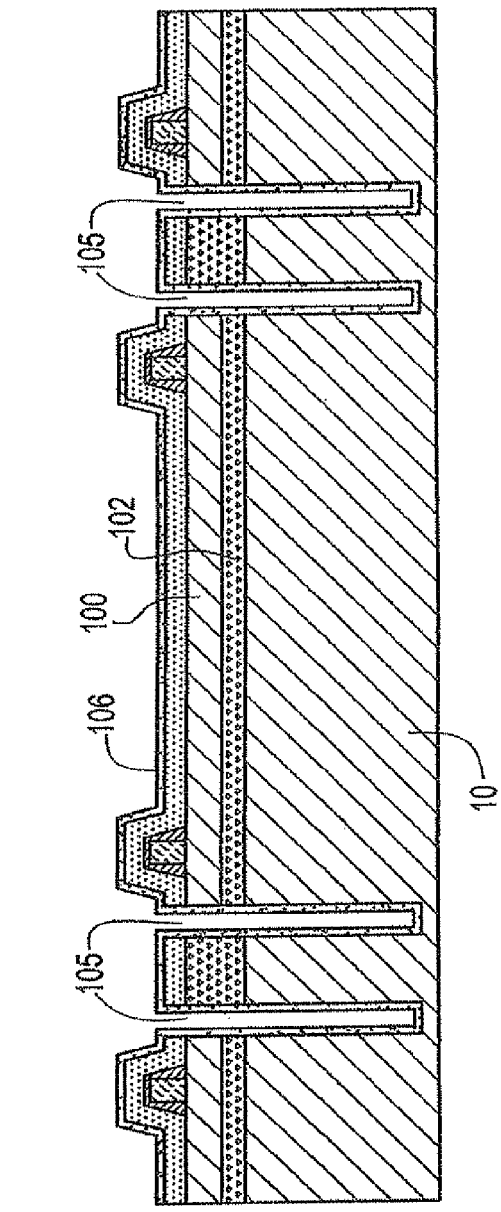

After trench formation, a thin metallic film 106, as shown in FIG. 4, is deposited over the entire structure of FIG. 3 as well as in the trenches 105, which will form the buried or outer electrodes of the trench capacitors of the present invention. The metallic film 106 may comprise any suitable metallic material(s) known in the art, including, but not limited to: metal(s), metal alloy(s), metal nitride(s), and/or metal silicide (s). Preferably, the metallic film 106 comprises at least one material selected from the group consisting of Ti, TiN, W, WN, and Ru. The preferred thickness of the metallic film 106 ranges from about 300 Å to about 1000 Å. Such a metallic film 106 can be readily deposited by any suitable deposition technique, including, but not limited to: atomic layer deposition (ALD), chemical vapor deposition (CVD), and physical vapor deposition (PVD). The deposition process preferably provides sufficient sidewall coverage in the trenches, so that the metallic film 106 is continuous.

In the event that the semiconductor substrate 10 contains a bulk semiconductor substrate, instead of the SOI structure as shown in FIGS. 1-4, additional implants, preferably angled implants, may be needed to introduce p-type dopant into the sidewalls of the trenches 105, in order to prevent potential shorting between the trench straps and the buried or outer electrodes, which are to be formed subsequently, and to allow biasing of the buried or outer electrodes. Preferably, p-type dopants, such as B or BF2, would be implanted in the unfilled trenches at 5-10° off the normal axis and using accelerating energies of 10 KeV or higher for B and 40 KeV or higher for BF2. Doses of 1E13-1E15 should provide sufficient p concentrations to prevent strap—plate shorting. Alternatively, a boron p-well can be implanted into the bulk semiconductor substrate to mitigate the potential strap-electrode shorting using accelerating energies of 125 KeV or higher and doses of 1E13 or higher. This process step can be done in the well module, and the p-doped region—introduced either through sidewall implants or through a high-energy well process—is electrically tied to ground.

After deposition of the metal layer 106, a planarizing film 107 is applied so such that the entire structure of FIG. 4 is covered by the film 107, as shown in FIG. 5. The film 107 specifically plugs the trenches 105. The film 107 is preferably formed of a photoresist or anti-reflective coating material applied by spin-on techniques to achieve planarity. Alternatively, any other material and technique can be used for forming the planarizing film 107, provided that the film 107 can be easily removed without damaging any device structure on, or in, the semiconductor substrate 10.

The film 107 is now etched back by using a well-controlled isotropic etching procedure such as a down-stream plasma ash. This removal procedure continues until the film 107 has been recessed below the top of the trench at the level of about half way through the buried isolator layer 102, to form the trench fill 107A as shown in FIG. 6.

FIG. 7 shows another isotropic etching step, such as a downstream plasma etching or a wet chemical etching step, which is used to selectively remove the metal layer 106 in such a manner that the metal film 106 recesses to about the same level as the trench filling 107A in the trench, to form the outer or buried electrodes 106A for the trench capacitors of the present invention.

FIG. 8 shows yet another isotropic etching step, which is used to completely remove the trench filing 107A from the trenches and to expose the outer or buried electrodes 106A.

Subsequent to the etching steps described hereinabove, a node dielectric film 108 and an inner electrode film 109 are deposited over the entire structure, as shown in FIG. 9. The node dielectric film 108 may comprise any dielectric material, including, but not limited to: hafnium oxide, barium strontium oxide, etc., and it may be deposited by any suitable dielectric deposition techniques, including, but not limited to: ALD, CVD, and PVD. Preferably, the node dielectric film 108 comprises a high-k dielectric material with a dielectric constant of not less than 4.0, which allows formation of shallower trenches at a given capacitance and therefore functions to further reduce the required device processing time and complexity. The thickness of the node dielectric film 108 preferably ranges from about 40 Å to about 500 Å. The inner electrode film 109 comprises at least one metallic material, including, but not limited to: metals, metal alloys, metal nitrides, metal silicides, etc. Preferably, the inner electrode film 109 comprises a metal or metal nitride, such as Ti, TiN, W, WN, Ru, etc., and it may be deposited by any suitable deposition techniques, such as ALD, CVD, or PVD. The thickness of the inner electrode film 109 preferably ranges from about 300 Å to about 1000 Å. More preferably, the top of the trenches 105 are completely closed after deposition of the node dielectric film 108 and the inner electrode film 109. Note that electrodes 106A and 109 may comprise the same or different materials.

FIG. 10 shows a further isotropic etching step, which selectively removes a portion of the inner electrode film 109, without removing other materials from the device structure. The portion of the inner electrode film 109 on the surface of the semiconductor substrate 10 is completely removed, and the portion of the inner electrode film 109 in the trenches 105 is preferably, but not necessarily, recessed back into the trenches by a thickness substantially equivalent to the thickness of the inner electrode film 109 itself.

FIG. 11 shows yet a further isotropic etching step, which selectively removes the node dielectric film 108 from the substrate surface. It is important to note that the node dielectric film 108 is recessed below the substrate surface but still above the BOX layer 102, thereby forming the node dielectric layers 108S for the trench capacitors, as shown in FIG. 11.

A photolithographic resist (not shown) is then applied to the entire structure of FIG. 11, preferably via a spin-on process. The photoresist is used to pattern the barrier layer 104, in such a manner that the regions (such as the source and drain regions of the transistors and the regions between the transistors and the trench capacitors) where metal silicide layers are to be formed in subsequent processing steps become exposed, while the other regions are still covered by the patterned barrier layer 104, as shown in FIG. 12. The barrier film 104 is preferably patterned by an etching process, such as an RIE process or a wet etching process, and the photoresist is removed afterwards by a well-known resist-stripping process, such as a downstream plasma ash process. Note that this mask does not pertain specifically to the trench MIMCap process flow but to the overall wafer process flow, since it involves salicide formation for all devices on the chip, which is a standard step in semiconductor chip processing.

Figure 13:
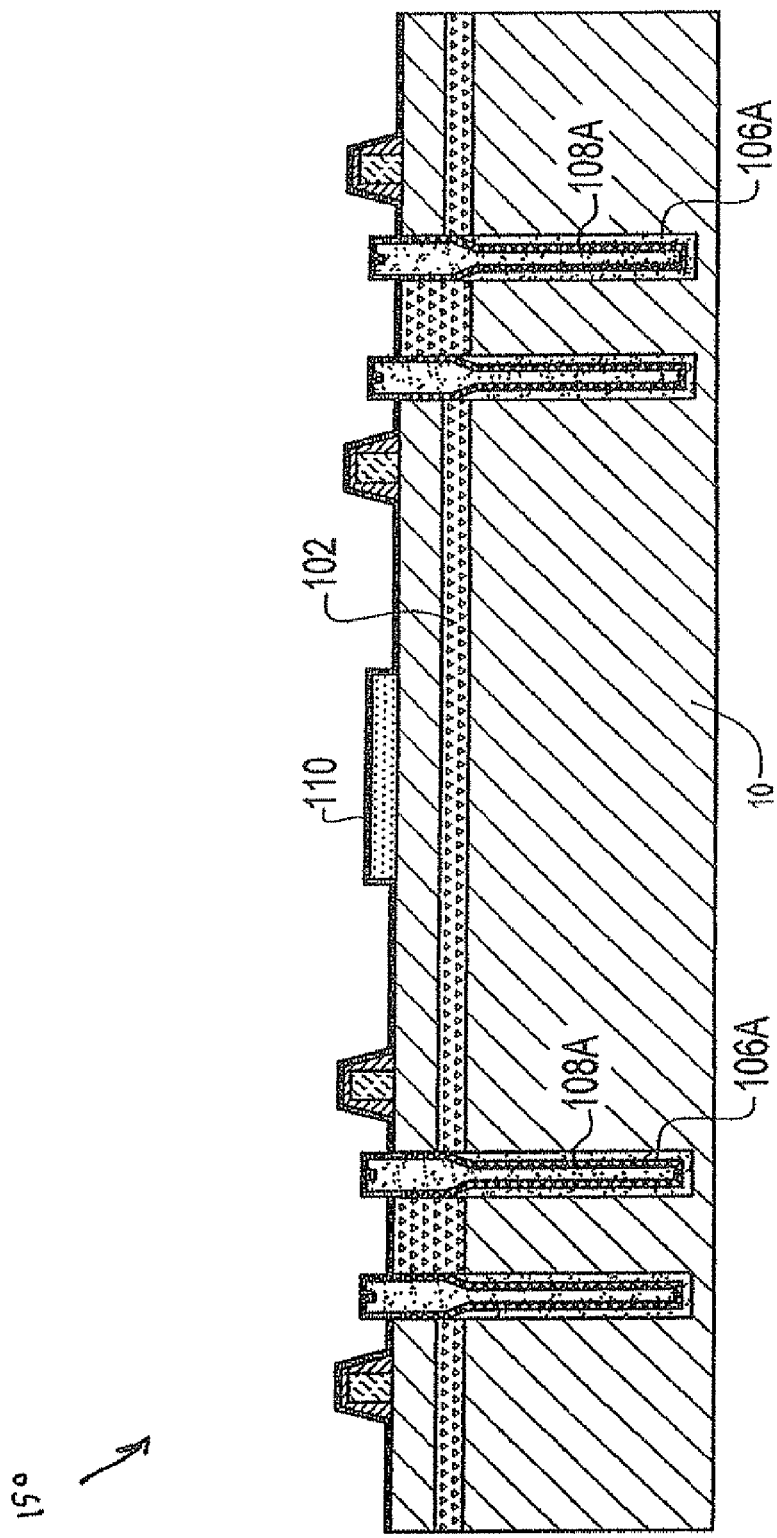
Figure 14:
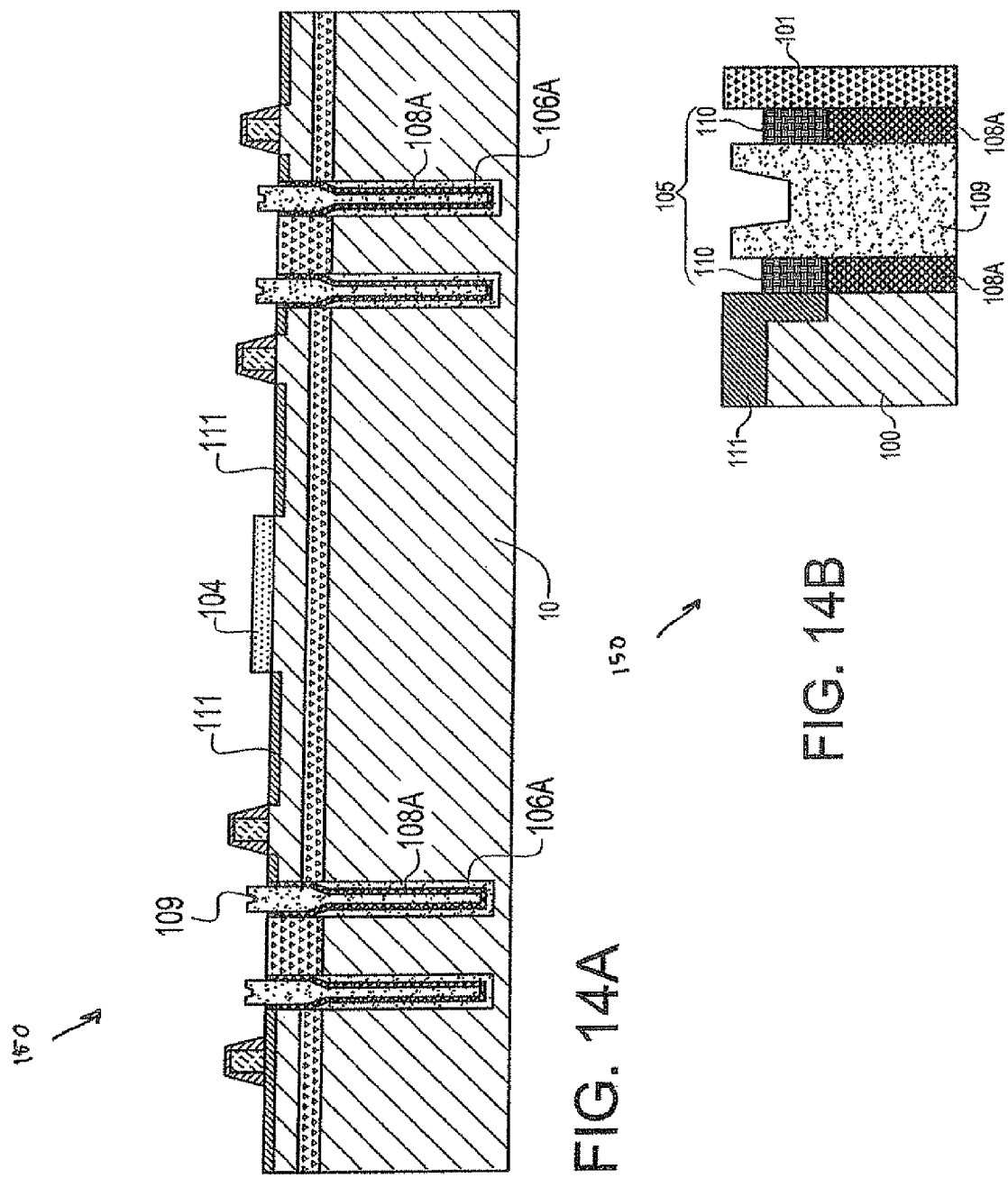

FIG. 13 shows the subsequent deposition of a silicide-forming metal layer 110, which may comprise any suitable metals or metal alloys that can react with silicon to form metal silicides. Preferably, but not necessarily, the metal layer 110 comprises Ti, Ta, W, Co, Ni, Pt, Pd and alloys thereof, and it is typically from about 300 to about 1000 Å thick and can be deposited by any suitable methods, such as ALD, CVD or PVD. It is noted that when the semiconductor substrate 10 does not include silicon, a silicon layer (not shown) can be formed atop the non-silicon-containing substrate prior to deposition of the metal layer 110.

The entire structure of FIG. 13 is then annealed at a predetermined elevated temperature at which the metal layer 110 reacts with silicon on the silicon-containing semiconductor substrate 10 or the silicon layer deposited over a non-silicon-containing substrate, to form metal silicides 111 of relatively low contact resistance, as shown in FIG. 14A. The annealing is typically performed in an inert gas atmosphere, e.g., He, Ar, $N_2$, or forming gas at relatively low temperatures ranging from about 100° C. to about 600° C., preferably from about 300° C. to about 500° C., and most preferably from about 300° C. to about 450° C., by using a continuous heating regime or various ramp and soak heating cycles. Unreacted metal is removed from the substrate surface after formation of the metal silicides 111.

For certain metals such as Co or Ti, a second annealing step may be employed to form metal silicides such as $CoSi_2$ or $TiSi_2$. Specifically, after deposition of the metal layer 110, a first annealing step is employed to form a metal silicide of a first silicide phase (e.g., CoSi or TiSi) of higher resistivity. Next, the unreacted metal is removed from the device structure, followed by a second annealing step carried out at a different annealing temperature to convert the metal silicide from the first silicide phase to a second silicide phase (e.g., $CoSi_2$ or $TiSi_2$) of lower resistivity.

The device structure shown in FIG. 14A therefore contains transistors with source/drain metal silicide contacts 111 as well as metal-insulator-metal (MIM) trench capacitors (including elements 106A, 108A, and 109) that are connected to the transistors by metal silicide straps 111. The metal-insulator-metal (MIM) trench capacitors and the metal silicide straps 111 have significantly reduced resistivity in comparison with the conventional trench capacitors having poly-Si electrodes and the conventional out-diffusion buried straps.

FIG. 14B shows an enlarged view of a region in FIG. 14A near the top of one of the trenches 105. Specifically, silicide-forming metal 110 is deposited in the trench 105 on top of the node dielectric layer 108A, which has been recessed as previously shown in FIG. 11. Part of the metal 110 will react with silicon outside of the trench 105 as well as silicon on the sidewalls of the trench 105 to form the metal silicide 111 immediately above the node dielectric layer 108A. The metal silicide 111 extends beyond the trench 105 and forms a metal silicide strap that directly contacts the source or drain of the adjacent transistor, as shown in FIG. 14A. Further, a portion of the metal silicide 111 will grow into the recess space above the node dielectric layer 108A, while a portion of the unreacted metal film 110 remains in the trench 105 after the metal-removing process and fills the rest of the recess space above the node dielectric layer 108A. The recess of the node dielectric layer 108A is designed so that a significant portion of unreacted metal 110 in the recess above 108A will not be removed by the metal-removing step. This portion of the unreacted metal 110 thus forms a direct metallic contact between the inner electrode 109 of the trench capacitor and the metal silicide 111 on the sidewalls of and outside of the trench 105, as shown in FIG. 14(b), which significantly reduces the contact resistance between the trench capacitor and the metal silicide 111.

Further, if the buried or outer electrode 106A of the trench capacitors also comprises silicide-forming metals, a portion of the buried or outer electrode 106A may react with silicon on the sidewalls of the trench 105 to form a metal silicide layer (not shown) between the electrode 106A and the surrounding semiconductor material thereby reducing the contact resistance required for biasing the buried or outer electrode 106A.

Figure 15:
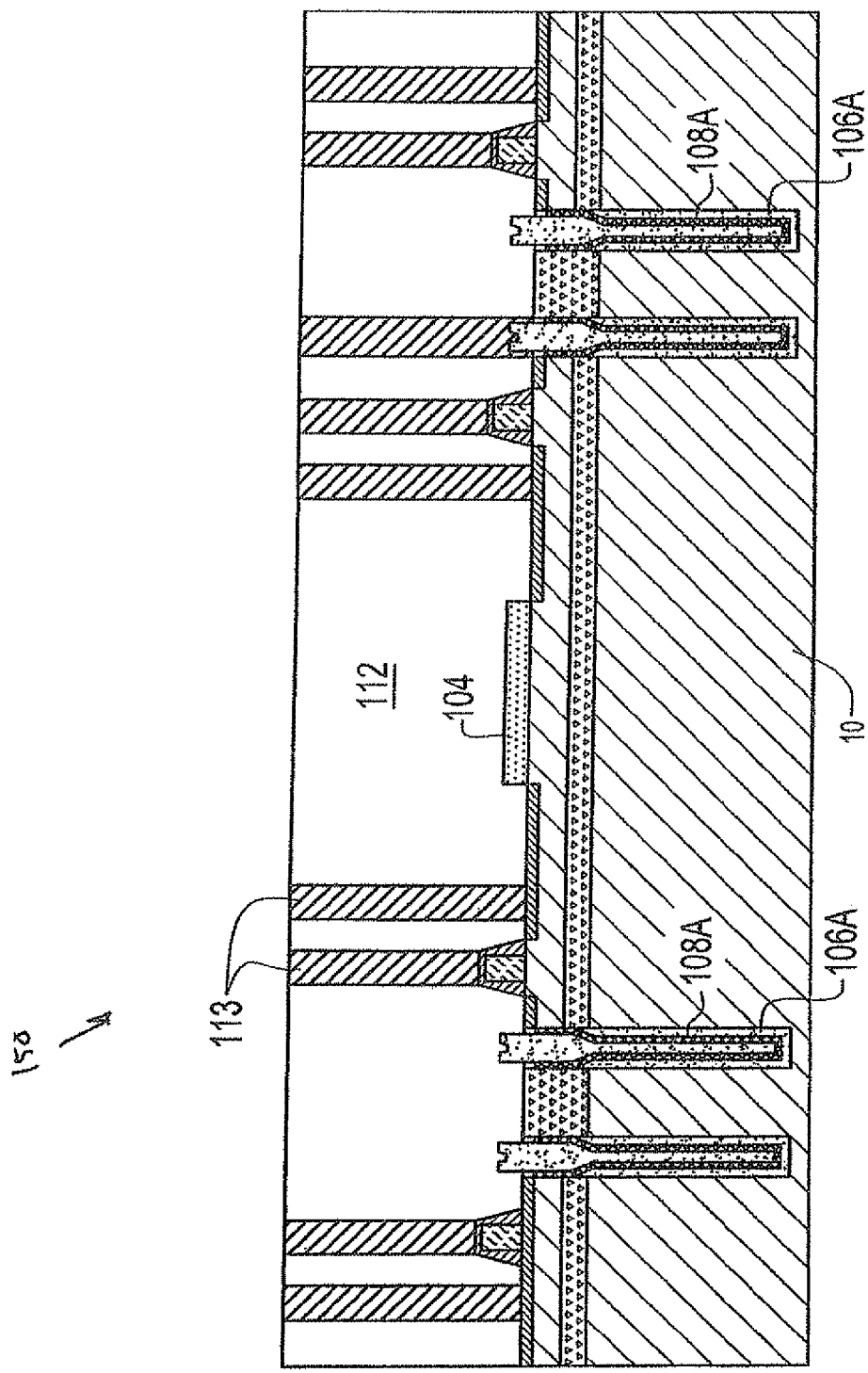

At this point, the processing of the trench capacitors is complete, and contacts to the device structure of FIG. 14A can be fabricated by conventional back-end-of-line (BEOL) processes. For example, an interlayer dielectric (ILD) 112 can be deposited over the device structure, which is then patterned to form contacts 113 to the transistors and the trench capacitors in the device structure, as shown in FIG. 15. Some of the contacts 113 may directly land on the trench capacitors, depending on the nature of the application.

The processing steps described hereinabove therefore form trench capacitors that have metallic electrodes and can be readily integrated into the salicidation module of a CMOS process flow. By introducing metal species to the semiconductor wafer after formation of the transistors and before the salicidation steps, the problem associated with metal contamination and migration is solved, which allows incorporation of MIM trench capacitors side-by-side with FETs into the eDRAM or DRAM devices. Further, the trench capacitors of the present invention are connected to the FET source/drain regions by metal silicide straps, which have much lower resistances than the conventional out-diffused straps and further reduce the parasitic series resistance in the device structure. Moreover, by obviating use of the poly-Si electrodes, the cost and process time of the trench capacitors is significantly reduced.

Figure 16:
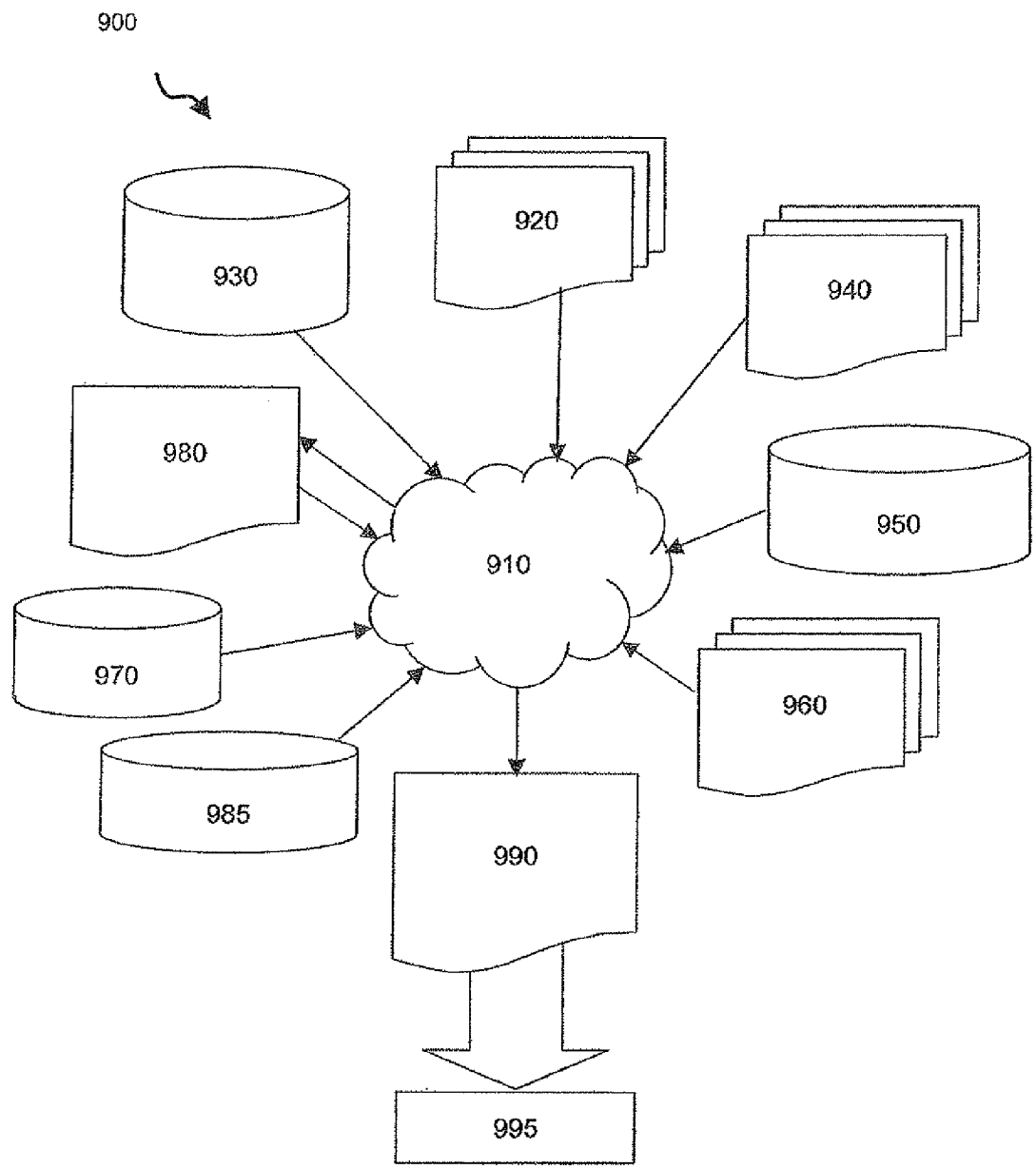
FIG. 16 is a flow diagram of a design process used in semiconductor designing, manufacturing and/or testing.

FIG. 16 shows a block diagram of an example design flow 900. Design flow 900 may vary depending on the type of IC being designed. For example, a design flow 900 for building an application specific IC (ASIC) may differ from a design flow 900 for designating a standard component. Design structure 920 is preferably an input to a design process 910 and may come from an IP provider, core developer, or other design company, or may be generated by the operator of the design flow, or from other sources. Design structure 920 comprises IC 150 (FIGS. 1-15) in the form of schematics or HDL, a hardware-description language (e.g., Verilog, VHDL, C, etc.). Design structure 920 may be a text file or a graphical representation of IC 150. Design process 910 preferably synthesizes (or translates) IC 150 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations for a given manufacturing technology (e.g., different technology nodes, 32 nm, 45 nm, 90 nm, etc.), design specifications 940, characterization data 950, verification data 960, design specifications 970, and test data files 985 (which may include test patterns and other testing information). Design process 910 may further include, for example, standard circuit design processes such as timing analysis, verification, design rule checking, place and route operations, etc. One of ordinary skill in the art of IC design can appreciate the extent of possible electronic design automation tools and applications used in design process 910 without deviating from the scope and spirit of the invention. The design structure of the invention is not limited to any specific design flow.

Design process 910 preferably translates embodiments of the invention, as shown in FIGS. 1-15, along with any additional integrated circuit design or data into a second design structure 990. Design structure 990 resides on a storage medium in a data format used for the exchange of layout data of integrated circuits (e.g., information stored in a GDSII (GDS2), GL1, OASIS, or any other suitable format for storing such design structures). Design structure 990 may comprise information such as, for example, test data files, design content files, manufacturing data, layout parameters, wires, levels of metal, vias, shapes, data for routing through the manufacturing line, and any other data required by a semiconductor manufacturer to produce embodiments of the invention, as shown in FIGS. 1-15. Design structure 990 may then proceed to a stage 995 where, for example, design structure 990: proceeds to tape-out, is released to manufacturing, is released to a mask house, is sent to another design house, is sent back to the customer, etc.

In summary, the present invention fulfills the need for high-density trench capacitors with low series resistance and good linearity, which can be fabricated at relatively lower costs and complexity, with little or no interference with the active device process flow.

While FIGS. 1-15 illustratively demonstrate several exemplary processing steps that can be used to form a device structure according to a specific embodiment of the present invention, it is clear that a person ordinarily skilled in the art can readily modify such process steps as well as device structures so formed for adaptation to specific application requirements, consistent with the above descriptions. For example, while the trench capacitors as illustrated hereinabove are designed for use as memory capacitors in the eDRAM or DRAM technology, it is clear that a person ordinarily skilled in the art can readily modify the trench capacitors of the present invention for use in other applications where capacitors are needed, such as decoupling capacitors, filters, etc. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A machine readable storage medium embodying a design structure, the design structure comprising:
   first data representing at least one trench capacitor that comprises a first metallic electrode layer located over interior walls of a trench in a substrate, a dielectric layer located in said trench over the first metallic electrode layer, and a second metallic electrode layer located in said trench over dielectric layer; and
   second data representing at least one field effect transistor (FET) located on said substrate, wherein the second metallic electrode layer of the trench capacitor is electrically connected to at least one of a source region and a drain region of the at least one FET by a metallic region, and said metallic region includes a metal silicide strap and a non-silicided metal, said non-silicided metal forms a direct contact between the second metallic electrode layer and the metal silicide strap.

2. The machine readable storage medium of claim 1, wherein the design structure comprises:
   a netlist which describes an integrated circuit (IC); and
   at least one of test data files, characterization data, verification data, or design specifications.

3. The machine readable storage medium of claim 2, wherein the design structure resides on a storage medium as a data format used for the exchange of layout data of the IC.

4. A machine readable storage medium embodying a design structure, the design structure comprising:
   first data representing a trench capacitor that comprises a first metallic electrode layer located over interior walls of a trench in a substrate, a dielectric layer located in said trench over the first metallic electrode layer, and a second metallic electrode layer located in said trench over the dielectric layer; and
   second data representing a field effect transistor (FET) located on said substrate, said FET comprising a source region, a drain region, a channel region between the source and drain regions, and a gate electrode over the channel region,
   wherein the second metallic electrode layer of the trench capacitor is electrically connected to at least one of the source and drain regions of the FET by a metallic region, said metallic region includes a metal silicide strap and a non-silicided metal, said non-silicided metal forms a direct contact between the second metallic electrode layer and the metal silicide strap.

5. The machine readable storage medium of claim 4, wherein the design structure comprises:
   a netlist which describes an integrated circuit (IC); and
   at least one of test data files, characterization data, verification data, or design specifications.

6. The machine readable storage medium of claim 5, wherein the design structure resides on a storage medium as a data format used for the exchange of layout data of the IC.

7. The machine readable storage medium of claim 1, wherein said first and second metallic electrode layers of said at least one trench capacitor comprise at least one metal, metal alloy, metal nitride, or metal silicide.

8. The machine readable storage medium of claim 1, wherein said first and second metallic electrode layers of said at least one trench capacitor comprise metallic material(s) selected from the group consisting of Ti, TiN, W, WN, Ru, and combinations thereof.

9. The machine readable storage medium of claim 1, wherein the substrate comprises a semiconductor-on-insulator structure.

10. The machine readable storage medium of claim 1, wherein the substrate comprises a bulk semiconductor structure.

11. The machine readable storage medium of claim 1, wherein the source and drain regions of the at least one FET comprise a metal silicide contact layer.

12. A machine readable storage medium embodying a design structure, the design structure comprising:
   first data representing at least one trench capacitor that comprises a first metallic electrode layer located over interior walls of a trench in a substrate, a dielectric layer located in said trench over the first metallic electrode layer, a second metallic electrode layer located in said trench over the dielectric layer; and
   second data representing at least one field effect transistor (FET) located on said substrate, said at least one FET comprising a source region, a drain region, a channel region between the source and drain regions, and a gate electrode over the channel region, wherein the second metallic electrode layer of the trench capacitor is electrically connected to at least one of the source and drain regions of the at least one FET by a metallic region, wherein said metallic region includes a metal silicide strap and a non-silicided metal, said non-silicided metal forms a direct contact between the second metallic electrode layer and the metal silicide strap.

13. The machine readable storage medium of claim 1, wherein said at least one trench capacitor further comprises a metal silicide layer located between the first metallic electrode layer and the interior walls of the trench in the substrate.

14. The machine readable storage medium of claim 1, wherein said at least one FET comprises a channel region located between said source region and said drain region; and a gate electrode over the channel region.

* * * * *